United States Patent
Wang et al.

(10) Patent No.: US 8,324,033 B2
(45) Date of Patent: Dec. 4, 2012

(54) TFT ARRAY SUBSTRATE AND MANUFACTURING METHOD THEREOF

(75) Inventors: Zhangtao Wang, Beijing (CN); Haijun Qiu, Beijing (CN); Tae Yup Min, Beijing (CN); Seung Moo Rim, Beijing (CN)

(73) Assignee: Beijing BOE Optoelectronics Technology Co., Ltd., Beijing (CN)

( * ) Notice: Subject to any disclaimer, the term of this patent is extended or adjusted under 35 U.S.C. 154(b) by 204 days.

(21) Appl. No.: 11/958,613

(22) Filed: Dec. 18, 2007

(65) Prior Publication Data

US 2008/0164470 A1    Jul. 10, 2008

(30) Foreign Application Priority Data

Jan. 4, 2007    (CN) .......................... 2007 1 0063236

(51) Int. Cl.
*H01L 21/00*    (2006.01)

(52) U.S. Cl. ................... 438/158; 257/E21.414; 349/43

(58) Field of Classification Search .............. 257/59, 257/72, 202, E29.003, E21.414; 438/158; 349/43, 138

See application file for complete search history.

(56) References Cited

U.S. PATENT DOCUMENTS

| | | | |
|---|---|---|---|
| 5,166,085 A * | 11/1992 | Wakai et al. | 438/158 |
| 5,926,235 A | 7/1999 | Han et al. | |
| 6,468,851 B1 * | 10/2002 | Ang et al. | 438/216 |
| 6,555,474 B1 * | 4/2003 | Huang et al. | 438/687 |
| 6,764,810 B2 * | 7/2004 | Ma et al. | 430/313 |
| 7,440,063 B2 | 10/2008 | Choi et al. | |
| 2004/0084672 A1 | 5/2004 | Tanaka et al. | |
| 2009/0085126 A1 * | 4/2009 | Yu et al. | 257/377 |

FOREIGN PATENT DOCUMENTS

| | | |
|---|---|---|
| GB | 2350467 A | 11/2000 |
| JP | 64-74755 | 3/1989 |
| JP | 2-214124 | 8/1990 |
| JP | 2000-148043 | 5/2000 |
| JP | 2002-368011 | 12/2002 |
| JP | 2003-101024 | 4/2003 |
| JP | 2006-154861 A | 6/2006 |
| JP | 2006-245557 A | 9/2006 |
| JP | 2006-287240 A | 10/2006 |
| KR | 2006-133746 | 12/2006 |
| KR | 2006-135179 | 12/2006 |

* cited by examiner

*Primary Examiner* — Matthew Landau
*Assistant Examiner* — Colleen E Snow
(74) *Attorney, Agent, or Firm* — Hasse & Nesbitt LLC; Daniel F. Nesbitt

(57) ABSTRACT

A TFT array substrate and a manufacturing method thereof, where the TFT array substrate includes a substrate; a gate line and a gate electrode integrated therewith, which are covered by a gate insulating layer, a semiconductor layer, and a ohmic contact layer sequentially. An insulating layer is formed on the resulting substrate and on both sides of the gate line and the gate electrode, the gate insulating layer, the semiconductor layer, and the ohmic contact layer. A trench is then formed in the ohmic contact layer to divide the ohmic contact layer over the semiconductor layer. A data line and first and second source/drain electrodes are then formed on the insulating layer and the ohmic contact layer.

9 Claims, 4 Drawing Sheets

TFT ARRAY SUBSTRATE AND MANUFACTURING METHOD THEREOF

BACKGROUND OF THE INVENTION

The present invention relates to a TFT array substrate of a thin film transistor liquid crystal display (TFT LCD) and a manufacturing method thereof.

In order to effectively reduce the manufacturing cost of a TFT LCD and improve its yield, the manufacturing process of the newly developed active driven TFT array substrate has been gradually simplified, for example, from a seven- or a six-photolithography process at the beginning to a current widely employed five-photolithography process. Recently, a four-photolithography process based on a slit photolithography process (a gray tone photolithography process) is applied in the field of TFT LCD manufacturing, the core step of which is to replace the second photolithography (an active layer photolithography) and the third photolithography (a source/drain metal layer photolithography) of the conventional five-photolithography process with one slit photolithography process. The detailed procedure of the four-photolithography process is described as follows.

Firstly, a gate metal layer is deposited on a substrate, a gate line and a gate electrode are formed by the first photolithography, and then a gate insulating layer, an active layer, an ohmic contact layer, and a source/drain metal layer are sequentially deposited on the gate line and the gate electrode on the substrate.

Next, with a slit photolithography process, a data line, an active area, source/drain electrodes, and a TFT channel pattern are formed through a source/drain metal layer wet etching and a multi-step etching (active layer etching—ashing—dry etching—ohmic contact layer etching).

Then, a passivation layer is deposited on the substrate and a via hole is formed in the passivation layer by the third photolithography.

Finally, a transparent conductive layer is deposited on the substrate and a pixel electrode is formed by the fourth photolithography and the pixel electrode is connected with one of the source/drain electrodes.

Compared with the conventional five-photolithography process, the four-photolithography process is mainly characterized in that the patterns of the active layer and the source/drain metal layer are formed by a single slit photolithography process, resulting in reduction of the production cycle and the manufacturing cost. However, since the process employs a slit mask, which requires a strict manufacturing accuracy for the photolithography, difficulty and cost for developing the process are increased remarkably and it is hard to increase the yield.

BRIEF DESCRIPTION OF THE INVENTION

In view of the above problems, the present invention provides a thin film transistor (TFT) array substrate and a method of manufacturing the same.

The first aspect of the present invention provides a TFT array substrate. The TFT array substrate comprises a substrate. A gate line and a gate electrode integrated therewith are formed on the substrate and covered by a gate insulating layer, a semiconductor layer, and an ohmic contact layer sequentially. An insulating layer is formed on the substrate and on both sides of the gate line and the gate electrode, the gate insulating layer, the semiconductor layer, and the ohmic contact layer. A trench is formed in the ohmic contact layer and divides the ohmic contact layer over the semiconductor layer. A data line and a first source/drain electrode integrated therewith are formed on the insulating layer and the ohmic contact layer, and a second source/drain electrode is formed on the insulating layer and the ohmic contact layer and opposes to the first source/drain electrode with respect to the trench. A passivation layer is formed on the data line and the first and second source/drain electrodes, and a via hole is formed in the passivation layer over the second source/drain electrode. A pixel electrode is formed on the passivation layer and connected with the second source/drain electrode through the via hole.

Preferably, the insulating layer may be an organic insulating layer, the material of which may be selected from the group consisting of epoxy resin, polyamine, pentacene, polyvinyl pyrrolidone, polyimide, and acryl resin, and a mixture thereof.

Preferably, a top surface of the insulating layer is flush with a top surface of the ohmic contact layer so as to form a substantially flat surface.

Preferably, the gate line, the gate electrode, the source electrode, the data line, and the drain electrode may be single-layered films formed of a material selected from the group consisting of Cr, W, Ti, Ta, Mo, Al, Cu, and an alloy thereof, or multi-layered films formed of a combination of the materials selected from the group consisting of Cr, W, Ti, Ta, Mo, Al, Cu, and an alloy thereof.

Preferably, the material of the gate insulating layer and the passivation layer may be an oxide, a nitride, or an oxynitride.

Another aspect of the present invention provides a method of manufacturing a TFT array substrate. The method comprises the following steps. Stacked layers of a gate metal layer, a gate insulating layer, a semiconductor layer, and an ohmic contact layer are sequentially formed on a substrate and are patterned to form a gate line and a gate electrode. An insulating layer is formed on the substrate, the thickness of which is larger than a total thickness of the gate metal layer, the gate insulating layer, the semiconductor layer and the ohmic contact layer, and the insulating layer is partially thinned to expose the ohmic contact layer. A source/drain metal layer is formed on the substrate and patterned to form first and second source/drain electrodes and a data line, and the ohmic contact layer is patterned to form a trench that divides the ohmic contact layer. The first and second source/drain electrodes oppose to each other with respect to the trench. A passivation layer is formed on the substrate and patterned to form a via hole in the passivation layer over the second source/drain electrode. A pixel electrode layer is deposited on the substrate and patterned to form a pixel electrode. The pixel electrode is connected with the second source/drain electrode through the via hole.

Preferably, the sequential depositing of the gate metal layer, the insulating layer, the semiconductor layer, and the ohmic contact layer may be performed continuously.

Preferably, the gate line and the gate electrode pattern may be formed by etching the gate metal layer, the insulating layer, the semiconductor layer, and the ohmic contact layer with a multi-step etching process.

Preferably, the insulating layer may be an organic insulating layer, the material of which may be epoxy resin, polyamine, pentacene, polyvinyl pyrrolidone, polyimide, or acryl resin. The organic insulating layer may be coated by a spin coating method.

Preferably, the insulating layer may be etched by an oxygen reactive ion etching process in cooperation with an endpoint detector. The organic insulating layer is partially thinned to expose the ohmic contact layer, so that a top surface of the organic insulating layer is flush with a top surface of the ohmic contact layer to form a substantially flat surface.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein.

DETAILED DESCRIPTION OF THE PREFERRED EMBODIMENTS

Exemplary embodiments of the present invention will be described hereinafter with reference to the accompanying drawings. However, the present invention can be realized in different ways and should not be limited to the embodiments set forth hereinafter. In the description, when a layer or a element is referred to as being "on" or "connected to" another layer or element, this layer or element can be directly on or directly connected to the other layer or element, or an intervening layer may also be present therebetween.

Figure 1:
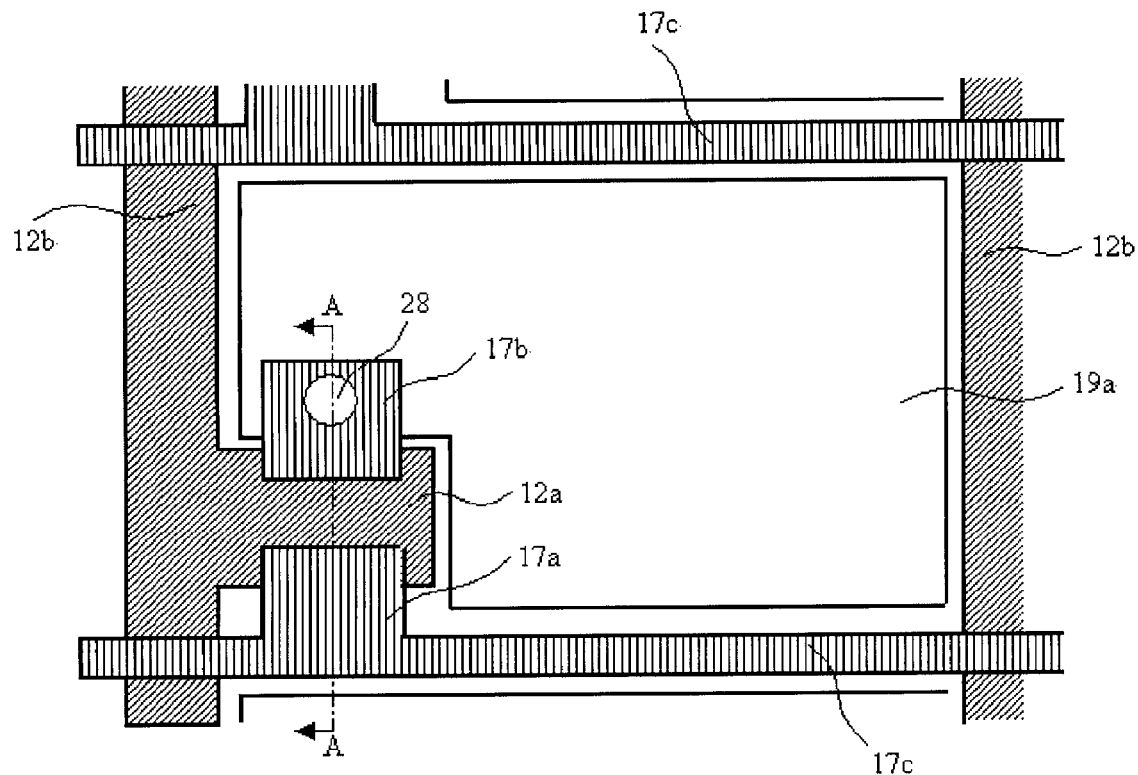
FIG. 1 is a plan view of a pixel area on a TFT array substrate according to an embodiment of the present invention.
Figure 2:
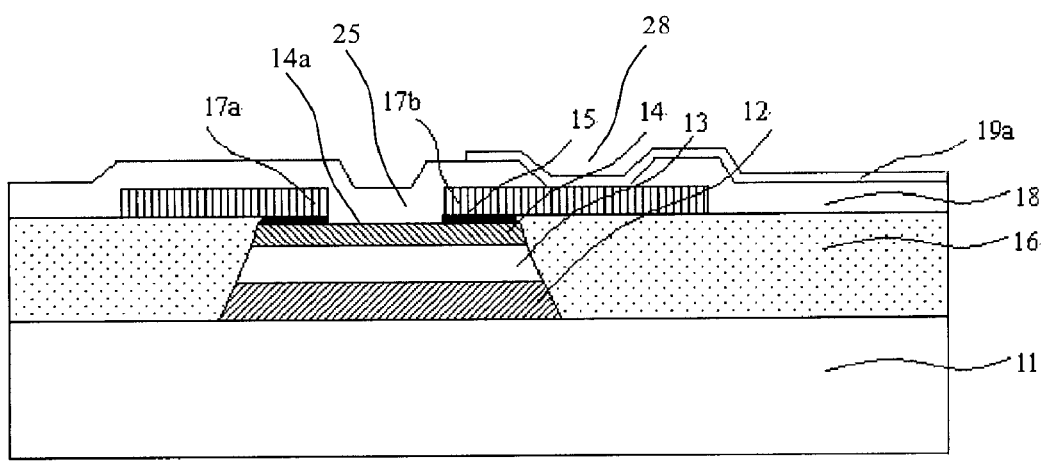
FIG. 2 is a cross-sectional view taken along the line A-A in FIG. 1.

FIG. 1 is a plan view of a pixel area on a TFT array substrate according to an embodiment of the present invention, and FIG. 2 is a cross-sectional view taken along the line A-A in FIG. 1.

As shown in FIG. 1, for example, the TFT array substrate according to the embodiment of the present invention comprises a plurality of gate lines 12b extending parallel to each other and a plurality of data lines 17c extending parallel to each other. These gate lines 12b and data lines 17c cross with each other so as to define a plurality of pixel areas on the TFT array substrate. Each pixel area comprises a TFT as a switching element and a pixel electrode 19a.

The construction of the pixel area on the TFT array substrate according to the embodiment of the present invention is described as follows. A gate metal layer 12 (including a gate electrode 12a and a gate line 12b), a gate insulating layer 13, a semiconductor layer 14 (e.g., an amorphous silicon (a-Si) layer), and an ohmic contact layer 15 (e.g., an n+ a-Si layer) are formed in this order on a substrate 11 such as a transparent glass substrate. An organic insulating layer 16 as an insulating layer is formed on the transparent substrate 11 on the both sides of the gate metal layer 12 (including the gate electrode 12a and the gate line 12b), the gate insulating layer 13, the semiconductor layer 14, and the ohmic contact layer 15. The thickness of the organic insulating layer 16 is substantially equal to the total thickness of the gate metal layer 12, the gate insulating layer 13, the semiconductor layer 14, and the ohmic contact layer 15. The top surface of the organic insulating layer 16 is substantially flush with the top surface of the ohmic contact layer 15 so as to form a substantially flat surface.

The ohmic contact layer 15 is formed on the semiconductor layer 14 and located at a source region and a drain region on the both ends of the semiconductor layer 14, with a trench 25 in the middle portion of the ohmic contact layer 15 on the semiconductor layer 14, and the trench 25 divides the ohmic contact layer 15 into two portions corresponding to the source region and the drain region so as to expose a channel region 14a of the semiconductor layer 14. Source/drain electrodes 17a, 17b are formed on the organic insulating layer 16 and the ohmic contact layer 15. A passivation layer 18 is formed on the organic insulating layer 16, the source/drain electrodes 17a, 17b, and the exposed channel region 14a of the semiconductor layer 14. A via hole 28 is formed in the passivation layer 18, for example, above the drain electrode 17b. A pixel electrode 19a is formed on the passivation layer 18 and connected with the drain electrode 17b through the via hole 28. The gate electrode 12a integrates with the gate line 12b and protrudes from the gate line 12b towards the pixel area.

For the TFT array substrate according to the embodiment, since the organic insulating layer 16 is formed on the substrate and the top surface of the organic insulating layer 16 is substantially flush with the top surface of the ohmic contact layer 15, the source/drain electrodes 17a, 17b are formed on the substantially flat surface, which reduces the possibility of occurrence of metal wire break and accumulation of internal stress in the passivation layer and therefore contributes to increase of yield. In the embodiment of the present invention, the organic insulating layer 16 as an example of the insulating layer may be formed of a polymeric material such as epoxy resin and polyamine, or may be formed of other organic insulating materials such as pentacene, polyvinyl pyrrolidone, polyimide, and acryl resin.

With reference to FIGS. 3 to 9, the method for manufacturing the TFT array substrate through a four-photolithography process according to an embodiment of the present invention will be described.

Firstly, on the substrate 11 such as a transparent glass substrate or a quartz substrate, the gate metal layer 12 with a thickness of 500-4000 Å is formed, for example, by a deposition method such as a sputtering or a thermal evaporation method. The gate metal layer 12 can be a single-layered film formed of a material selected from the group consisting of Cr, W, Ti, Ta, Mo, Al, Cu, and an alloy thereof, or a multi-layered film formed of a combination of the materials selected from the group consisting of Cr, W, Ti, Ta, Mo, Al, Cu, and an alloy thereof.

Figure 3:
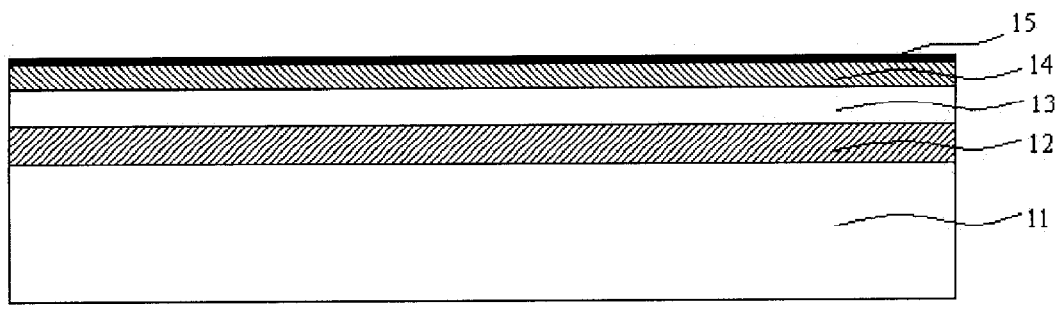
FIG. 3 is a cross-sectional view after a gate metal layer, a gate insulating layer, a semiconductor layer, and an ohmic contact layer are sequentially formed on the substrate according to an intermediate step in making the embodiment of the present invention.

Then, the gate insulating layer 13 with a thickness of about 1000 to about 4000 Å, the semiconductor layer 14 with a thickness of about 1000 to about 2500 Å, and the ohmic contact layer 15 with a thickness of about 300 to about 600 Å are sequentially formed on the gate metal layer 12, for example, by a plasma enhanced chemical vapor deposition (PECVD) method. The resulting stacked layers are shown in FIG. 3. The gate insulating layer 13 can be formed of a material selected from the group consisting of an oxide, a nitride, and an oxynitride, such as silicon oxide, silicon nitride and silicon oxynitride, and a mixture thereof, and the corresponding reaction gas may be a mixture of $SiH_4$, $NH_3$, and $N_2$, or a mixture of $SiH_2Cl_2$, $NH_3$, and $N_2$. The reaction gas for the semiconductor layer 14 and the ohmic contact layer 15 may be a mixture of $SiH_4$ and $H_2$, or a mixture of $SiH_2Cl_2$ and $H_2$, and a P source gas, such as $PH_3$, needs to be introduced as a dopant during forming the ohmic contact layer 15 so as to obtain an n+ a-Si layer.

Figure 4:
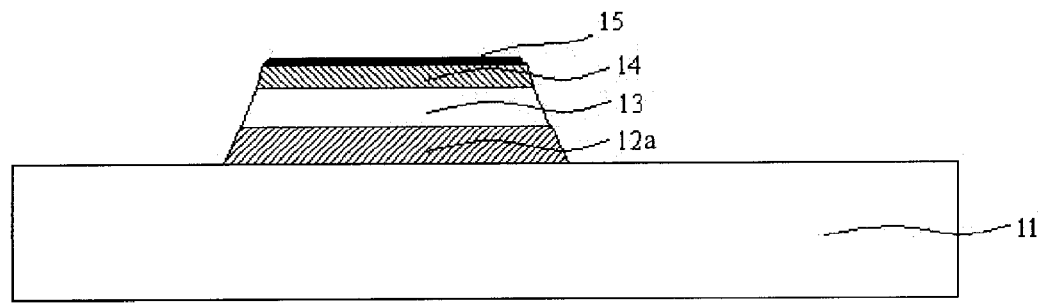
FIG. 4 is a cross-sectional view taken along the line A-A in FIG. 1 after a multi-step etching is performed according to the embodiment of the present invention.
Figure 5:
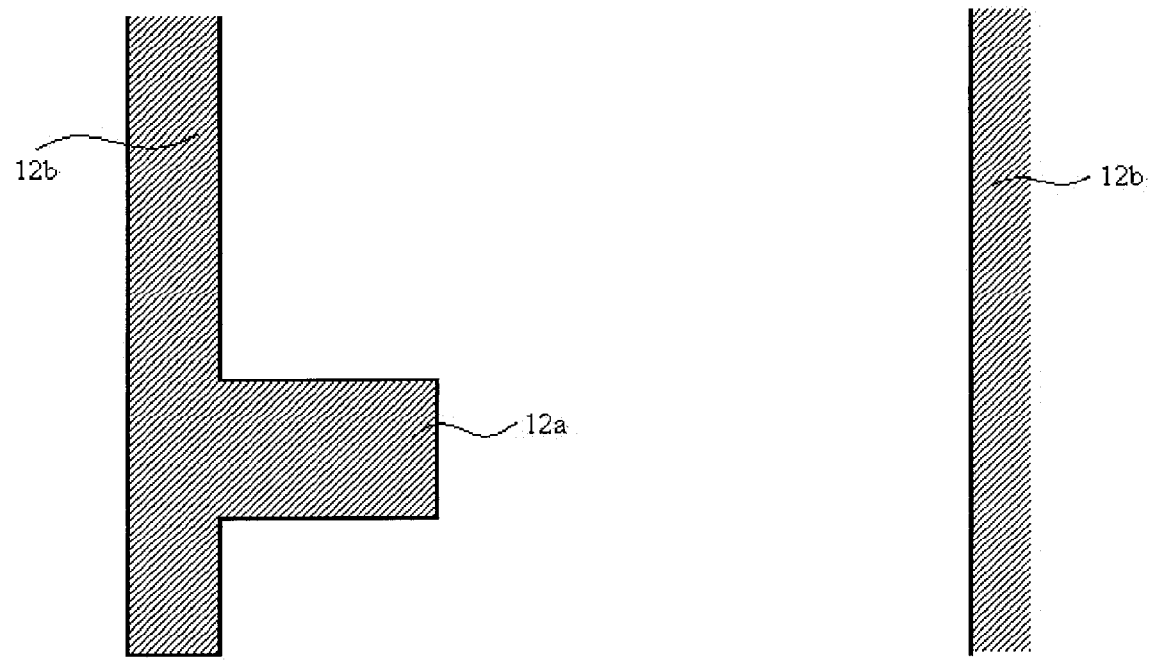
FIG. 5 is a plan view after the multi-step etching is performed according to the embodiment.

The desired gate line and gate electrode pattern is formed by the first photolithography. A photoresist pattern is formed on the above stacked layers, and then portions of the gate metal layer 12, the gate insulating layer 13, the semiconductor layer 14, and the ohmic contact layer 15, which are not covered by the photoresist pattern, are etched by using a multi-step etching process. The resulting cross-sectional view is shown in FIG. 4, and the plan view of the patterned gate metal layer 12 is shown in FIG. 5, in which the gate electrode 12a protrudes from the gate line 12b. The etching gas for the gate metal layer 12 may be $SF_6/O_2$ or $Cl_2/O_2$, the etching gas for the gate insulating layer 13 may be $SF_6/O_2$, $Cl_2/O_2$ or $HCl/O_2$, and the etching gas for the semiconductor layer 14 and the ohmic contact layer 15 may be $SF_6/Cl_2$ or $SF_6/HCl$. Finally, the remaining photoresist pattern is removed by lifting off with a chemical solution. The above multi-step etching process can be performed continuously to obtain the desired pattern.

Figure 6:
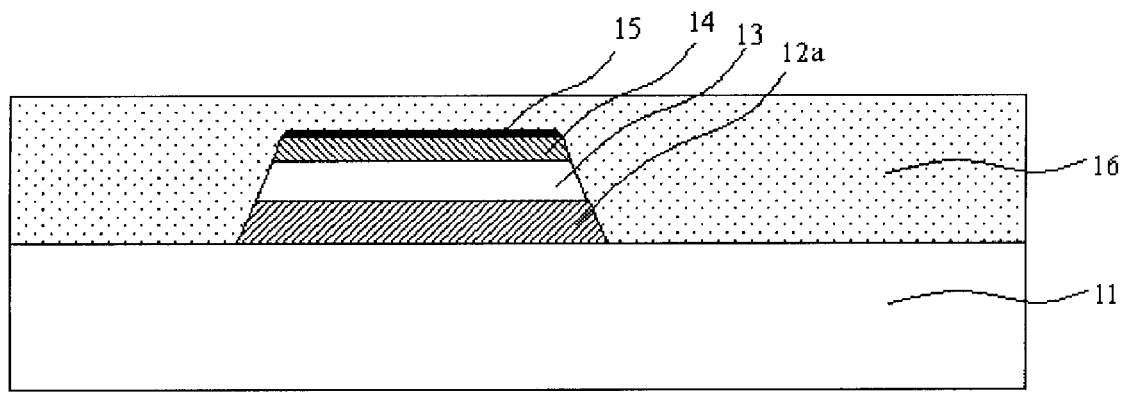
FIG. 6 is a cross-sectional view taken along the line A-A in FIG. 1 when an insulating layer is formed on the substrate after the multi-step etching according to the embodiment.
Figure 7:
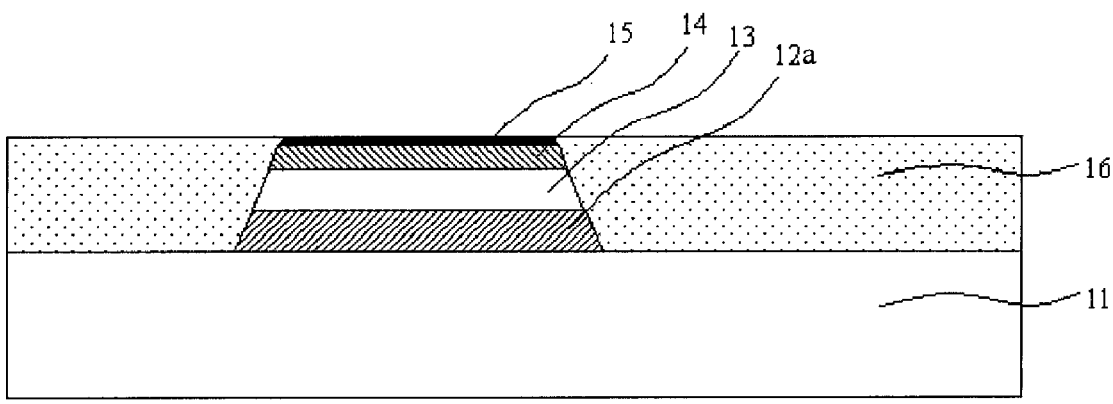
FIG. 7 is a cross-sectional view taken along the line A-A in FIG. 1 after an oxygen ion reaction etching process is performed on the insulating layer according to the embodiment.

The organic insulating layer 16 is uniformly formed, for example, by spin coating on the transparent glass substrate 11 and the ohmic contact layer 15 after forming the patterns of the gate metal layer 12, the gate insulating layer 13, and the semiconductor layer 14. The organic insulating layer 16 is cured, for example, by heating or irradiation of ultra-violet (UV) light, and the resulting cross-sectional view is shown in FIG. 6. The thickness of the coated organic insulating layer 16 is larger than the total thickness of the gate metal layer 12, the gate insulating layer 13, the semiconductor layer 14, and the ohmic contact layer 15, as shown in FIG. 6. After the organic insulating layer 16 is cured, the organic insulating layer 16 is partially thinned by a certain thickness, for example, by using an oxygen reactive ion etching (RIE) process in cooperation with an endpoint detector (EPD), so that the ohmic contact layer 15 is exposed completely, and the top surface of the organic insulating layer 16 is substantially flush with the top surface of the ohmic contact layer 15 so as to form a layered substrate having a substantially flat surface, as shown in FIG. 7. However, it should be understood by those skilled that, in another embodiment of the present invention, there may be a certain step between the top surface of the organic insulating layer 16 and that of the ohmic contact layer 15, the implementation of the invention will not be influenced disadvantageously.

On the above obtained flat surface, a source/drain metal electrode layer 17 is deposited, for example, by a sputtering or a thermal evaporation method with a thickness of about 500 to about 2500 Å, and also the source/drain metal electrode layer 17 may be a single-layered film formed of a material selected from the group consisting of Cr, W, Ti, Ta, Mo, Al, Cu, and an alloy thereof, or a multi-layered film formed of a combination of the materials selected from the group consisting of Cr, W, Ti, Ta, Mo, Al, Cu, and an alloy thereof.

Figure 8:
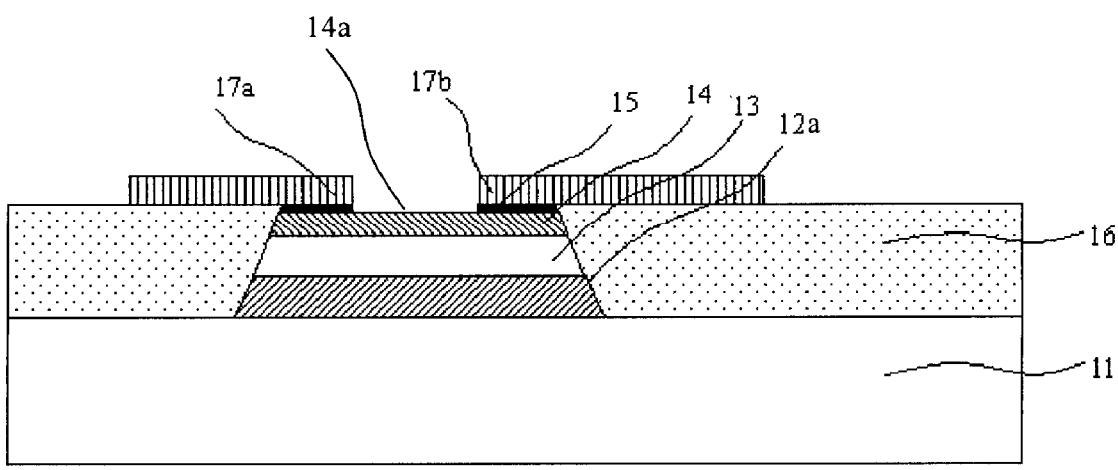
FIG. 8 is a cross-sectional view taken along the line A-A in FIG. 1 after source/drain electrodes are formed according to the embodiment.
Figure 9:
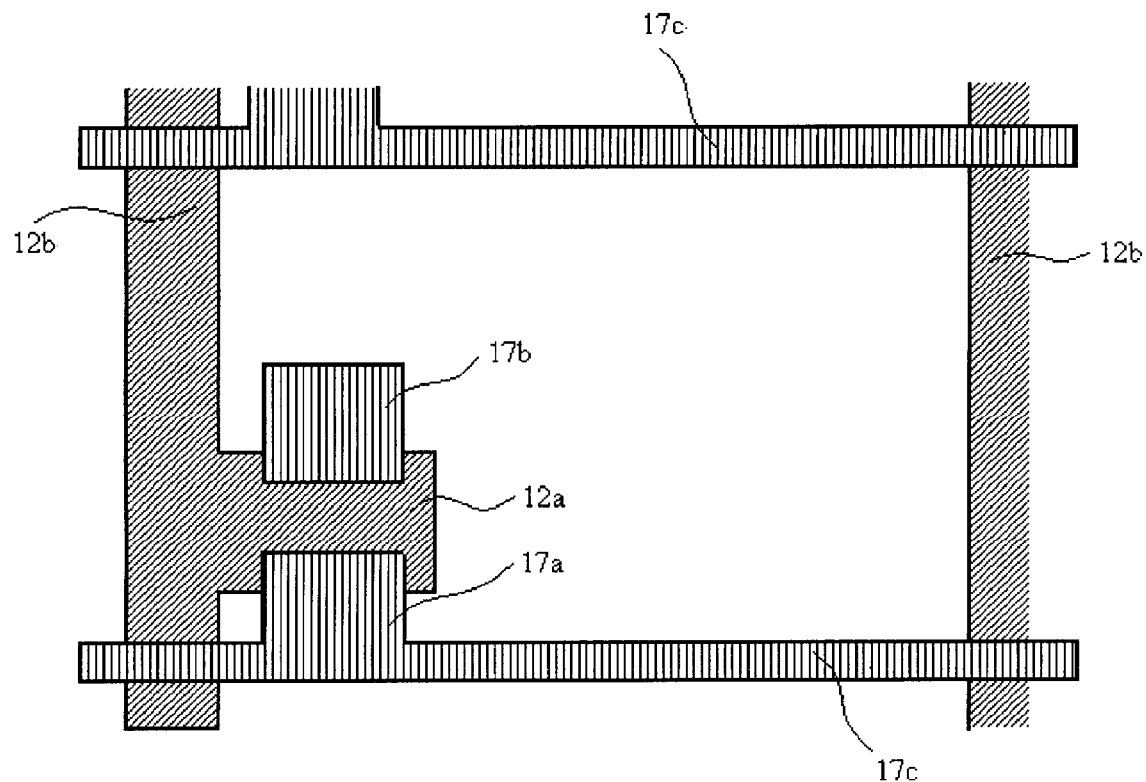
FIG. 9 is a plan view after the source/drain electrodes are formed according to the embodiment.

The data line 17c and the source/drain electrodes 17a, 17b are formed by the second photolithography. The etching method may be a dry etching method or a wet etching method. The resulting source/drain electrodes 17a, 17b cover the organic insulating layer 16 as well as the ohmic contact layer 15. The trench 25 is formed by removal of the middle portion of the ohmic contact layer 15 above the semiconductor layer 14 to divide the ohmic contact layer 15 into two portions corresponding to the source and drain regions and expose the channel region 14a of the TFT. During the second photolithography process, a photoresist pattern is formed on the source/drain metal layer 17, and then the uncovered portion of the source/drain metal layer 17 is etched to form the source/drain electrodes 17a, 17b. Next, the exposed ohmic contact layer 15 is further etched by a dry etching method so as to form the trench 25 to expose the TFT channel, and the resulting cross-sectional view is shown in FIG. 8. The etching gas for the ohmic contact layer 15 may be $SF_6/Cl_2$ or $SF_6/HCl$. Finally, the remaining photoresist pattern in the second photolithography is removed by lifting off with a chemical solution so as to obtain a plan view as shown in FIG. 9.

Figure 10:
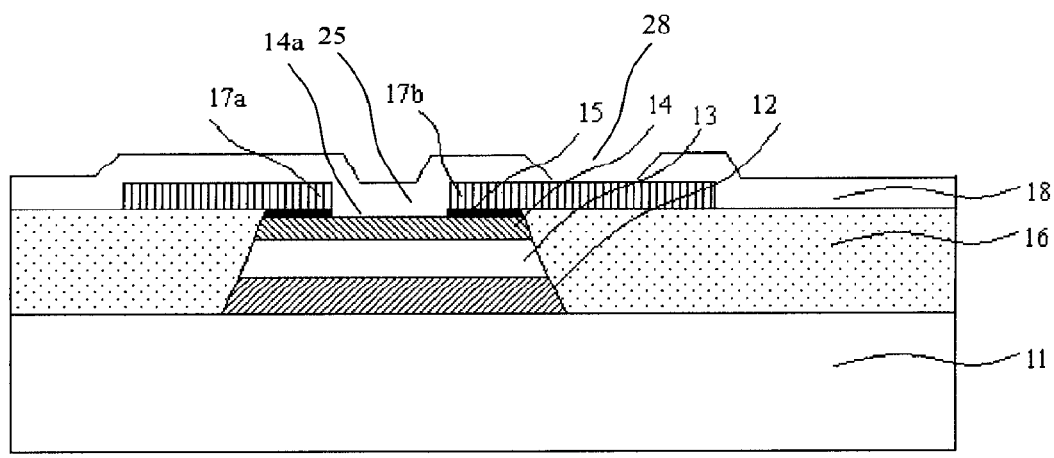
FIG. 10 is a cross-sectional view taken along the line A-A in FIG. 1 after a passivation layer pattern (via hole pattern) is formed according to the embodiment.

After the source/drain electrodes 17a, 17b are formed, the passivation layer 18 with a thickness of about 700 to about 2000 Å is deposited by a PECVD method. The passivation layer 18 can be formed of a material selected from the group consisting of oxide, nitride, and oxynitride, and the corresponding reaction gas may be a mixture of $SiH_4$, $NH_3$, and $N_2$ or a mixture of $SiH_2Cl_2$, $NH_3$, and $N_2$. Then the via hole 28 is formed by the third photolithography process, and the resulting cross-sectional view is shown in FIG. 10. The etching gas may be $SF_6/O_2$, $Cl_2/O_2$ or $HCl/O_2$.

After the via hole 28 is formed, a transparent conductive layer 19 with a thickness of about 300-600 Å is deposited on the substrate by a sputtering or a thermal evaporation method. The material of the transparent conductive layer 19 may be indium tin oxide (ITO), indium zinc oxide (IZO), zinc oxide (ZnO), and the like. The transparent conductive layer 19 is patterned by the fourth photolithography to form the pixel electrode 19a that is connected with the drain electrode 17b through the via hole 28, as shown in FIG. 2. Finally, the remaining photoresist pattern in the fourth photolithography is removed with a chemical solution to form the plan view as shown in FIG. 1.

In the embodiments of the present invention, the TFT array substrate can be manufactured by a four-photolithography process. Since there is no slit photolithography used for manufacturing the array substrate, difficulty and cost of the process can be remarkably decreased and high yield can be ensured.

Although the present invention has been described in detail referring to the preferred embodiments, the above embodiments are used only for illustration and not for the purpose of limitation. Accordingly, it will be understood by those of ordinary skill in the art that it is possible to use other materials and equipments if necessary, and that various modifications or equivalent alterations may be made to the embodiments of the present invention without departing from the spirit and scope of the present invention as set forth in the following claims.

What is claimed is:

1. A method of manufacturing a thin film transistor (TFT) array substrate, comprising the following steps performed in the order presented:
   (a) forming stacked layers of a gate metal layer, a gate insulating layer, a semiconductor layer, and an ohmic contact layer sequentially on a substrate, and then patterning the stacked layers of the gate metal layer, the gate insulating layer, the semiconductor layer, and the ohmic contact layer to form a pattern of a gate line and a gate electrode;
   (b) forming an insulating layer on the resulting substrate of step (a), a thickness of which is greater than a total thickness of the gate metal layer, the gate insulating layer, the semiconductor layer, and the ohmic contact layer, and thinning the insulating layer partially to expose the ohmic contact layer;
   (c) forming and patterning a source/drain metal layer on the resulting substrate of step (b) to form first and second source/drain electrodes and a data line and to expose the ohmic contact layer between the first and second source/drain electrodes, and patterning the exposed ohmic contact layer to form a trench that divides the ohmic contact layer, the first and second source/drain electrodes opposing to each other with respect to the trench;
   (d) forming and patterning a passivation layer on the resulting substrate to form a via hole in the passivation layer over the second source/drain electrode; and
   (e) forming and patterning a pixel electrode layer on the resulting substrate to form a pixel electrode that is connected with the second source/drain electrode through the via hole.

2. The method according to claim 1, wherein in the step (a), the sequential forming of the gate metal layer, the gate insulating layer, the semiconductor layer, and the ohmic contact layer on the resulting substrate is performed continuously.

3. The method according to claim 1, wherein in the step (a), the gate line and the gate electrode are formed by etching the gate metal layer, the insulating layer, the semiconductor layer, and the ohmic contact layer with a multi-step etching.

4. The method according to claim 1, wherein in the step (b), the insulating layer is an organic insulating layer.

5. The method according to claim 4, wherein the organic insulating layer is coated by a spin coating method.

6. The method according to claim 4, wherein the organic insulating layer is formed of a material selected from the group consisting of epoxy resin, polyamine, pentacene, polyvinyl pyrrolidone, polyimide, and acryl resin.

7. The method according to claim 4, wherein in the step (b), the thinning process is an oxygen reactive ion etching process in cooperation with an endpoint detector.

8. The method according to claim 4, wherein in the step (b), after the organic insulating layer is thinned partially to expose the ohmic contact layer, a top surface of the organic insulating layer is flush with a top surface of the ohmic contact layer to form a substantially flat surface.

9. The method according to claim 1, wherein in the step (b), after the insulating layer is partially thinned to expose the ohmic contact layer, the top surface of the insulating layer is flush with the top surface of the ohmic contact layer to form a substantially flat surface.

* * * * *